United States Patent [19]

Maeder et al.

[11] 4,071,784
[45] Jan. 31, 1978

[54] MOS INPUT BUFFER WITH HYSTERESIS

[75] Inventors: Heinz Bernhard Maeder, Weinfelden, Switzerland; Gene Arnold Schriber, Austin, Tex.

[73] Assignee: Motorola, Inc., Schaumburg, Ill.

[21] Appl. No.: 741,446

[22] Filed: Nov. 12, 1976

[51] Int. Cl.$^2$ .................. H03K 3/295; H03K 3/353
[52] U.S. Cl. ............................. 307/279; 307/270; 307/290; 307/DIG. 1
[58] Field of Search ............ 307/205, 214, 270, 279, 307/290, 304, DIG. 1, DIG. 5, 251

[56] References Cited

U.S. PATENT DOCUMENTS

| | | | |
|---|---|---|---|
| 3,775,693 | 11/1973 | Proebsting | 307/214 X |
| 3,873,856 | 3/1975 | Gerlach | 307/279 |
| 4,023,122 | 5/1977 | Oura | 307/251 X |

*Primary Examiner*—Larry N. Anagnos
*Attorney, Agent, or Firm*—Joe E. Barbee

[57] ABSTRACT

An MOS input buffer circuit includes an input connected to the gate electrode of an enhancement mode input MOSFET. The drain of the input MOSFET is connected to the output of the input buffer circuit. The source of the input MOSFET is connected to the drain of a second depletion mode MOSFET having its source connected to ground and its gate connected to a $V_{DD}$ voltage conductor. A load circuit is coupled between the $V_{DD}$ voltage conductor and the output, and consists of an enhancement mode MOSFET and a depletion load MOSFET coupled in series between output and $V_{DD}$ voltage conductor. A third depletion mode MOSFET has its drain connected to the $V_{DD}$ voltage conductor, its source connected to the source of the input MOSFET, and its gate connected to the output. The positive gain (or negative slope) portion of the switching characteristic of the input buffer circuit extends substantially all the way between the high and low output levels.

6 Claims, 3 Drawing Figures

MOS INPUT BUFFER WITH HYSTERESIS

BACKGROUND OF THE INVENTION

In recent years it has become possible to implement many complex logic functions on a single semiconductor die utilizing the MOS technology, wherein thousands of MOSFETS (metal oxide semiconductor field effect transistor) or IGFETS (insulated gate field effect transistor), as they are also commonly called are utilized to implement such products as 4096 bit decoded random access memories, 8192 bit readonly only memories, and complete microprocessors. Input buffer circuits are required on all of these circuits in order to permit the MOS LSI chips to receive digital signals from the environment in which it will operate. Most of the input buffer circuits have been inverters or latchers of various types. In designing MOS input buffer circuits, the main problems to be overcome by the circuit designer have been to provide input buffer circuits which produce adequate logical "1" and logical "0" output levels (to be utilized by other circuitry within the MOS LSI circuit) in response to worst case input "1" and "0" logic levels over the ranges of permissible variations in power supply voltage levels, MOSFET threshold voltages and other MOS processing parameters. Although many MOS input buffer circuits have been designed, no one input buffer circuit has proven completely satisfactory for a wide range of practical applications.

SUMMARY OF THE INVENTION

It is an object of this invention to provide a buffer circuit having a hysteresis characteristic in which the positive gain portion of the switching characteristic extends substantially all the way between the high and low output voltage levels.

It is another object of the invention to provide a buffer circuit having a switching characteristic having minimum dependence upon voltage supply variations and manufacturing parameter variations.

Briefly described, the invention is a buffer circuit having an input and an output, and including a first enhancement mode field effect input transistor having its gate coupled to the input, its drain coupled to the output, and its source coupled to a first node. A load device or load circuit is coupled between the output and a first voltage conductor. A current source is coupled between a first node and a second voltage conductor for providing a current path between the first node and the second voltage conductor. A resistive device responsive to the output is coupled to the first node for producing a bilateral resistive characteristic between the output and the first node. In a preferred embodiment, the resistive device is a depletion mode field effect transistor having its drain coupled to the first voltage conductor, its source coupled to the first node, and a gate coupled to the output.

DESCRIPTION OF THE INVENTION

Figure 1:
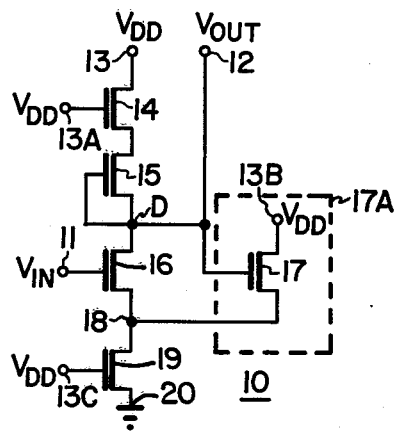
FIG. 1 is a schematic diagram of a preferred embodiment of the invention.

Referring to FIG. 1, input buffer 10 has an input 11 and an output 12, and is energized by $V_{DD}$ conductor 13 and ground conductor 20. Input node 11 is connected to the gate electrode of input MOSFET 16, which is an enhancement mode MOSFET. The drain of enhancement mode MOSFET 16 is connected to node 12, and its source is connected to node 18. Those skilled in the art will recognize that MOSFETs are of two types: enhancement mode and depletion mode. An enhancement mode MOSFET is in off condition if its gate and source are at the same voltage. For example, if MOSFET 16 is an N-channel MOSFET, it might have a threshold voltage of approximately two volts, meaning that the gate-to-source voltage would have to exceed two volts before the MOSFET would conduct a current between the source and drain electrodes. An N-channel depletion mode MOSFET may be thought of as having a negative threshold voltage, so that when the source and gate are at the same voltage, the negative threshold voltage is exceeded and the device conducts current between its source and drain electrodes. For a more complete discussion of MOSFETs, see "Physics and Technology of Semiconductor Devices," A.S. Grove, John Wiley & Sons, New York, 1957. For a more thorough description of the depletion mode MOSFETs, see "MOSFETs In Circuit Design", by Robert Crawford, McGraw Hill, 1967. Those skilled in the art will recognize that MOSFETs are bilateral devices. That is, the current-carrying terminals (the source and drain) designated source and drain may be interchanged in digital applications. Current can flow in either direction through a MOSFET, depending upon the relative voltages at the gate, source, and drain. In a given circuit, a particular electrode can serve the function of source part of the time and drain at other times.

Depletion mode MOSFET 19 has its drain connected to node 18, its source connected to ground conductor 20, and its gate connected to $V_{DD}$ conductor 13C. However, it is not necessary that conductor 13C be connected to exactly the same voltage as conductor 13. Depletion mode MOSFET 17 has its gate connected to output node 12, its source connected to node 18, and its drain connected to conductor 13B, which could also be $V_{DD}$ volts. The dotted line encompassing MOSFET 17 and indicated by reference numeral 17A indicates that some other resistive device responsive to $V_{OUT}$, the voltage at node 12, could be utilized in place of MOSFET 17.

Depletion load MOSFET 15 has its source and gate connected to node 12, and its drain connected to the source of enhancement mode MOSFET 14. Enhancement mode MOSFET 14 has its gate connected to conductor 13A, which could be at $V_{DD}$ volts, and its drain connected to conductor 13, which is at $V_{DD}$ volts.

Figure 3:
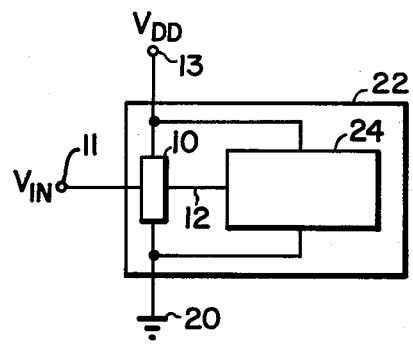
FIG. 3 is a diagram illustrating an application of the input buffer circuit of FIG. 1 in an MOS LSI semiconductor die.

FIG. 3 illustrates a practical aplication of the buffer circuit of FIG. 1 as an input buffer circuit for an MOS/LSI semiconductor die 22. Semiconductor die 22 includes a section 24 of complex internal circuitry which must receive a representation of an input signal externally applied to semiconductor die 22. Buffer circuit 10 has its output 12 connected to complex circuitry 24, and has input 11 externally available for application of an input signal $V_{IN}$ thereto. Ground conductor 20 and $V_{DD}$ conductor 13 are coupled to buffer circuit 10 as shown in FIG. 1 and are also coupled to complex internal circuitry 24 as indicated in FIG. 3.

Figure 2:
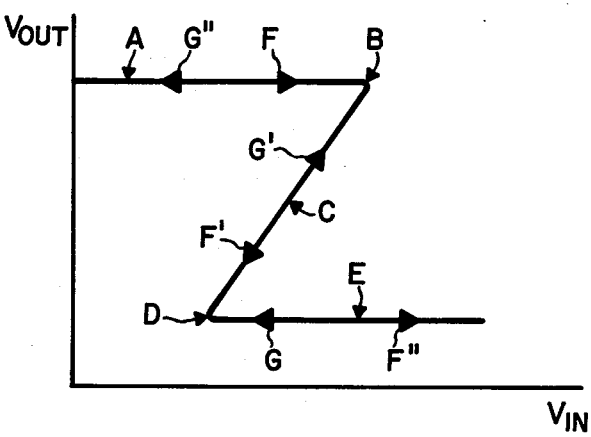
FIG. 2 is a graph illustrating a switching characteristic of the circuit of FIG. 1.

The description of the operation of the buffer circuit in FIG. 1 is recited with particular reference to the switching characteristic of FIG. 2 as well as the circuit schematic of FIG. 1.

For the purposes of understanding the operation, it will be helpful to refer to the following table of exemplary ratios of channel length and channel width for the MOSFETs of FIG. 1.

| MOSFETS | Channel Width (Microns) | Channel Length (Microns) |
|---|---|---|
| 14 | 50 | 6 |
| 15 | 14 | 38 |
| 16 | 200 | 8 |
| 17 | 14 | 22 |
| 19 | 26 | 15 |

Assume that $V_{IN}$ is initially zero. Then $V_{OUT}$ is at a logical "1" level equal to $V_{DD}$ minus the sum of the gate-to-source voltage of MOSFET 14 and the source-to-drain voltage of MOSFET 15, each of which are functions of the current in MOSFETs 14 and 15, respectively. MOSFET 16 is in the off condition, so that all of the current flowing through MOSFET 19 flows through depletion MOSFET 17. The voltage $V_{18}$ at node 18 depends of the value of $V_{DD}$ and the relative channel width-to-length ratios of MOSFETs 17 and 19. When $V_{IN}$ exceeds the sum of the threshold voltage of MOS 16 plus the value of the voltage at node 18, current will begin to flow through MOSFET 16. Since MOSFET 16 has a much greater channel width-to-length ratio than MOSFET 14 and 15, a slight further increase in $V_{IN}$ will cause a large increase in the current through MOSFET 16, thereby causing $V_{OUT}$ to decrease rapidly. Therefore the gate-to-source voltage of MOSFET 17 decreases, and the current through MOSFET 17 therefore decreases. Therefore the current through MOSFET 19 also decreases, and the voltage at node 18 decreases, thereby turning MOSFET 16 on still harder, thereby causing $V_{OUT}$ to decrease still faster. The buffer circuit 10 goes into a positive gain portion of its operation corresponding to segment C in FIG. 2. The positive feedback through MOSFET 17 continues until the gain of the input inverter (14, 15, 16, 19) is sufficiently low such that the change in current through MOSFET 17 becomes insensitive to changes in $V_{IN}$. $V_{OUT}$ is then at the level indicated by E in FIG. 2.

Next the operation of buffer circuit 10 is considered when $V_{IN}$ is initially at a logical "1" voltage, and is gradually reduced to zero volts. The circuit theoretically switches along the path indicated by the arrows G, G' and G" in FIG. 2. When $V_{IN}$ is high, at any point along segment E, MOSFET 16 is on. Since $V_{OUT}$, node 12, is at a more positive potential than node 18, and since MOSFET 17 is a depletion mode MOSFET, it is clear that MOSFET 17 remains on. Therefore, as $V_{IN}$ is reduced in value, MOSFET 16 tends to be turned more and more toward the off condition, and $V_{OUT}$ increases somewhat. MOSFET 17 is then turned on harder, causing the voltage at node 18 to rise. This feedback from node 12 to node 18 tends to turn MOSFET 16 off even more, so that at point D on the curve of FIG. 2, buffer circuit 10 switches regeneratively up to segment A.

According to the present invention, it is very important that MOSFET 17 be a depletion mode MOSFET, so that when $V_{IN}$ is high, along segment E in FIG. 2, MOSFET 17 will still be in the on condition, so that the feedback from node 12 to node 18 is continuous. If MOSFET 17 were an enhancement mode device, it would be in an off condition when $V_{IN}$ is at a logical "1". Then, if $V_{IN}$ were decreased along segment E, and as $V_{OUT}$ began to increase, MOSFET 17 would be still in an off condition until $V_{OUT}$ exceeded the voltage at node 18 by an amount equal to the threshold voltage of MOSFET 17, so there would be no regenerative feedback until $V_{OUT}$ exceeded the voltage at node 18 by an amount somewhat in excess of the threshold voltage of MOSFET 17. The lower portion of the segment C, near point D, in FIG. 2, would then be quite gradually, rather than abruptly, rounded, and only a small portion of the segment C would have a positive slope, corresponding to a positive gain during the switching operation. During the portion of the switching characteristic in which the gain was negative, small amounts of noise on the input would be amplified and appear at the output. Provision of the depletion mode MOSFET 17 overcomes this handicap.

If depletion mode MOSFET 19 were replaced by an enhancement mode MOSFET, buffer circuit 10 would still operate, but it would not track with MOSFET 17 over temperature as well as if it were a depletion mode device. Also, gate 13C of MOSFET 19 could be connected either to $V_{IN}$ or to ground, but the tracking with $V_{DD}$ would not be nearly as good as it is in the preferred embodiment in which gate 13C is connected to $V_{DD}$. As $V_{DD}$ increases, the current through 19 increases but, MOSFET 19 is turned on harder, tending to hold the voltage at node 18 at a constant value. Further, a single load device coupled between node 12 and $V_{DD}$ could be utilized in place of a series combination of enhancement mode MOSFET 14 and depletion mode MOSFET 15, but it has been found that provision of enhancement mode MOSFET 14 tends to compensate the temperature variations of enhancement mode MOSFET 16, while depletion mode MOSFET 15 tends to compensate the temperature variations of depletion mode MOSFETs 17 and 19.

Other types of feedback could be utilized between node 12 and node 18. For example, MOSFET 17 could be replaced by a polycrystalline silicon resistor connected between node 12 and node 18.

What is claimed is:

1. An input circuit having an input and output comprising:
   a first field effect transistor coupled between a first voltage conductor and a first node;
   a second field effect transistor coupled between said first node and said output;
   a third field effect transistor coupled between said output and a second node and having its gate coupled to said input;
   a fourth field effect transistor coupled between a second voltage conductor and said second node, and having its gate coupled to said first voltage conductor; and
   a fifth field effect transistor coupled between said first voltage conductor and said second node and having its gate coupled to said output, said second, fourth, and fifth field effect transistors being depletion mode.

2. A circuit having an input and an output comprising: a first enhancement mode field effect transistor having its gate coupled to said input, its drain coupled to said output, and its source coupled to a first node; load means coupled between said output and a first voltage conductor; first means coupled between said first node and a second voltage conductor for providing a current path between said first node and said second voltage conductor; second means coupled between said output and said first node for providing additional voltage at said first node, said second means including a first depletion mode field effect transistor having its gate coupled to said output its drain coupled to said first voltage conductor and its source coupled to said first node.

3. The circuit as recited in claim 2 wherein said load means includes a second enhancement mode field effect transistor coupled between said first voltage conductor and said output.

4. The circuit as recited in claim 2 wherein said load means includes a second depletion mode field effect transistor coupled between said first voltage conductor and said output.

5. The circuit as recited in claim 2 wherein said load means includes a second enhancement mode field effect transistor and a second depletion mode field effect transistor coupled in series between said first voltage conductor and said output.

6. The circuit as recited in claim 2 wherein said first means includes a second depletion mode field effect transistor having its gate coupled to said first voltage conductor, its drain coupled to said first node, and its source coupled to said second voltage conductor.

* * * * *